United States Patent [19]
Thomas

[11] 3,912,849

[45] Oct. 14, 1975

[54] COMPOSITE PRINTED CIRCUIT BOARD

[75] Inventor: Lucius Ponder Thomas, Indianapolis, Ind.

[73] Assignee: RCA Corporation, New York, N.Y.

[22] Filed: Sept. 9, 1974

[21] Appl. No.: 504,359

Related U.S. Application Data

[63] Continuation of Ser. No. 345,667, March 28, 1973, abandoned.

[52] U.S. Cl. .................... 174/16 R; 29/625; 29/626; 174/35 R; 174/68.5; 317/100; 317/101 B; 317/101 C

[51] Int. Cl.$^2$ .................... H01B 7/34; H01B 9/06

[58] Field of Search ........... 174/15 R, 16 R, DIG. 5, 174/68.5, 35 R; 317/100, 101 B, 101 CC, 101 CM; 29/626, 625

[56] References Cited

UNITED STATES PATENTS

| | | | |
|---|---|---|---|
| 2,796,559 | 6/1957 | Feucht | 317/100 |
| 2,881,364 | 4/1959 | Demer et al. | 317/100 |
| 3,141,998 | 7/1964 | Silkman | 317/100 |
| 3,646,399 | 2/1972 | Mars et al. | 174/68.5 X |
| 3,780,798 | 12/1973 | Reimer | 317/100 X |

*Primary Examiner*—Darrell L. Clay
*Attorney, Agent, or Firm*—Glenn H. Bruestle; William S. Hill

[57] ABSTRACT

An insulating board and a sheet metal board are laminated together, with the metal board covering only a part of the mounting surface of the insulating board. Low-power circuit components are mounted on the exposed face of the insulating board, and high-power circuit elements are mounted on the metal board.

6 Claims, 6 Drawing Figures

COMPOSITE PRINTED CIRCUIT BOARD

This application is a continuation of application Ser. No. 345,667, filed Mar. 28, 1973, now abandoned.

BACKGROUND OF THE INVENTION

Most mass-produced electronic apparatus now includes so-called "printed circuit" boards for mounting circuit components and for connecting the components together with a minimum of hand-wiring. These printed circuit boards have mostly been laminates composed of thin sheets of fibrous material impregnated with a synthetic resin. This type of board has advantages such as light weight, good impact strength and good electrical insulation such that a network of conductors can be adhered to a surface.

However, the laminated insulating type board also has some disadvantages. Some power components which generate considerable heat, cannot be mounted directly on the board because of danger of overheating the board. Also, some other types of high power components such as power transistors which do not pose any potential hazard if mounted directly on a board, still should not be so mounted because heat is not conducted away from the device fast enough to prevent the device from overheating and thus burning out or deteriorating. Consequently, some components of apparatus, such as those mentioned above, have had to be either separately mounted on metal frames or have special heat-sinks provided for them. This has added considerably to the cost of manufacture of the product.

Because of the heat dissipation problem and the potential fire hazard, attempts have been made to use a circuit board comprising a metal core and insulating surfaces. For example, an aluminum board with anodized surfaces has been tried. Aluminum or sheet steel boards with various types of resin coatings have also been used. These have not been entirely successful because of disadvantages such as formation of pinholes in the insulating coating and consequent shorting out of conductors. If the insulating coating is made thick enough to assure complete absence of pin holes, the ability of the board to conduct heat away from circuit components is greatly decreased. Also, a certain amount of potential fire hazard has remained in the type of board having a resin coating because of the flammable nature of organic materials. Another disadvantage of the resin-coated metal board is increased capacitance introduced in some types of circuits.

The present invention is a laminated insulating-board-sheet metal board which minimizes heat hazards in electronic apparatus but provides both heat sink and air flow-thru mounting for power components. The improved board permits more optimum design of electronic circuits from the standpoints of minimizing unwanted capacitance while maximizing heat sinking and providing substantial fire protection. The improved board also has resulted in reducing the amount of hand-wiring required in certain types of electronic apparatus such as TV sets. This not only reduces factory cost, it increases reliability of the product.

THE DRAWING

DESCRIPTION OF PREFERRED EMBODIMENTS

Figure 1:
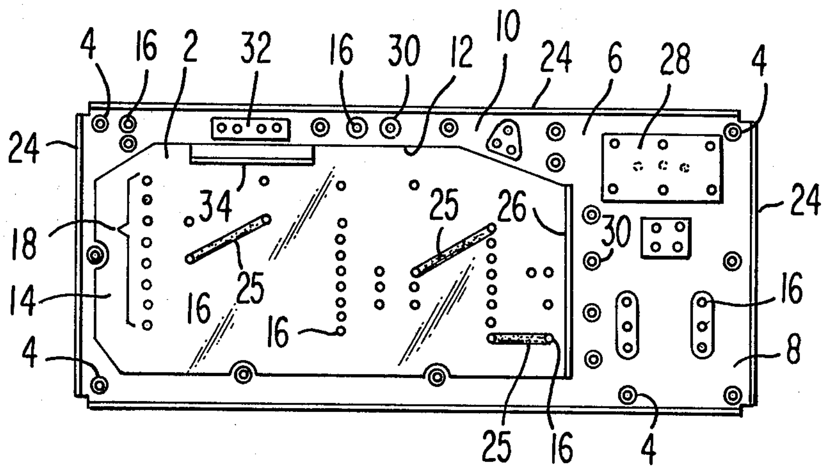
FIG. 1 is a top plan view of one embodiment of a composite circuit board of the present invention.
Figure 2:
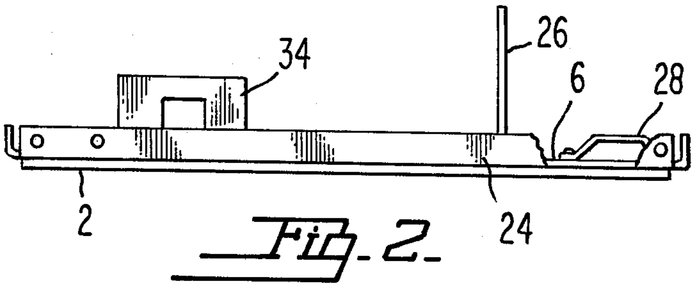
FIG. 2 is a front elevation view of the circuit board of FIG. 1.

As shown in FIGS. 1 and 2, one embodiment of a circuit board in accordance with the present invention, comprises a conventional insulating board 2, such as a fibre glass-epoxy type, to which is laminated, as by riveting with rivets 4, a sheet metal board 6. The metal board 6 may be composed of sheet aluminum or sheet steel, for example.

The metal board 6 has a main portion 8 and also a frame portion 10 extending around the periphery of the insulating board 2 to strengthen it and also to provide a good heat conducting medium for mounting some of the circuit components. The metal board 6 also has a large opening 12 therein which exposes a considerable area of the top surface 14 of the insulating board 2.

The insulating board 2 has a number of small openings 16 therethrough. These openings 16 are just large enough to accommodate the wire leads of various types of circuit components such as resistors, capacitors, transistors and transformers which are mounted on the board. Certain groups 18 of openings 16 are designed to accommodate the base sockets of plug-in modules. These plug-in modules are smaller size circuit boards with mounted components, which are vertically mounted to conserve space and also provide circuit portions which can easily be removed and either repaired or replaced if the circuit fails.

Figure 3:
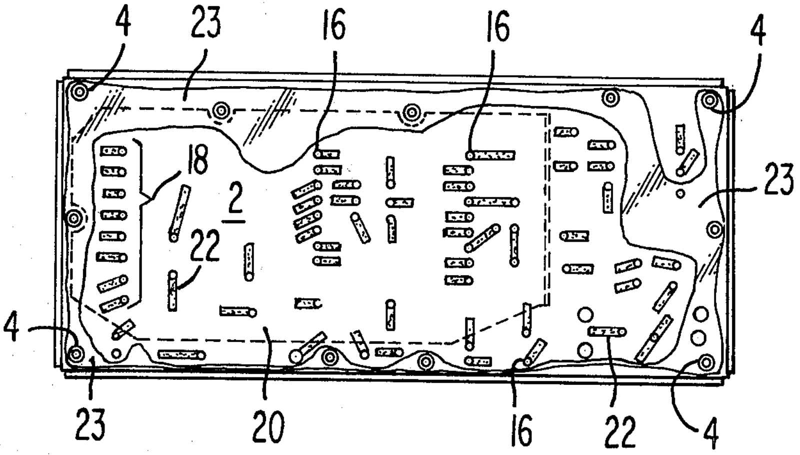
FIG. 3 is a bottom plan view of the circuit board of FIGS. 1 and 2.

On the underside 20 of the insulating board 2 is a network of printed conductors 22 (FIG. 3) which have been shown in incomplete cut-off form. When all of the circuit components are mounted in the openings 16, the leads which extend through the openings are soldered to the ends of the conductors 22 in a single pass through a solder bath. The underside of the board may have relatively large metallized areas 23 which also serve as a ground and a shield.

The top surface 14 of the insulating board 2 may also have conductors 25 connecting some of the holes 16. Although these conductors 25 have been shown on the exposed area of the surface 14, they may also be on parts of the surface 14 which are covered with the metal board 6 if the conductors are covered with insulation.

The metal board 6 has its edges bent vertically to form a mounting flange 24. The main portion 8 of the metal board 6 is nearly completely isolated from the remainder of the apparatus by means of a metal shield 26 which is a vertically bent portion of the metal plate 6. The shield 26 has as its main function that of serving as an electrical field shielding means. It is intended that potentially hazardous components such as a high voltage fly-back transformer on a TV set, be mounted behind this shield on the metal board.

The main portion 8 of the metal board 6 also may have one or more metal mounting standoffs 28, the metal being curved such that the central portion of the standoff is spaced from the metal plate 6. A heat-generating circuit component such as a power transistor (not shown) may be mounted on the standoff. This type of mount enables heat emitted by the transistor to be conducted rapidly away from the device and dissipated into the atmosphere. At the same time, it permits a replaceable socket to be used for the transistor.

The metal board 6 also has a number of openings 30 therein which surround the smaller size openings 16 in the insulating board 2. These openings 30 are large enough so that leads mounted in the openings 16 will not contact the metal board 6 and cause a short circuit.

In addition to its strengthening function, the frame portion 10 of the metal board 6 may also have high power components mounted thereon. Thus, the frame portion 10 may have one or more other metal mounting standoffs 32 attached thereto. Power transistors or other high heat generating units may be mounted on the standoffs 32. Adjacent the standoff 32 may be another shield means 34 which also consists of a vertically bent portion of the metal board 6. The shield 34 may also serve to increase the heat-dissipating characteristics of the device mount.

Figure 4:
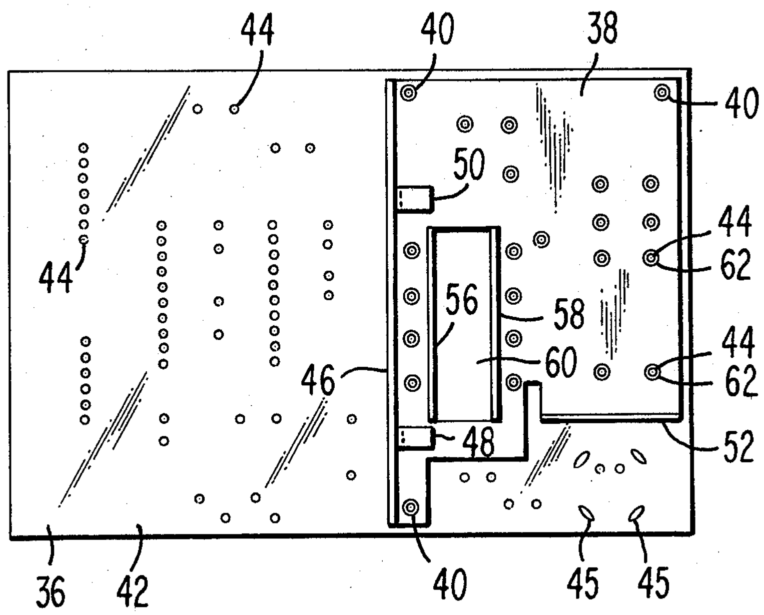
FIG. 4 is a top plan view of an alternative embodiment of a composite circuit board of the invention.
Figure 5:
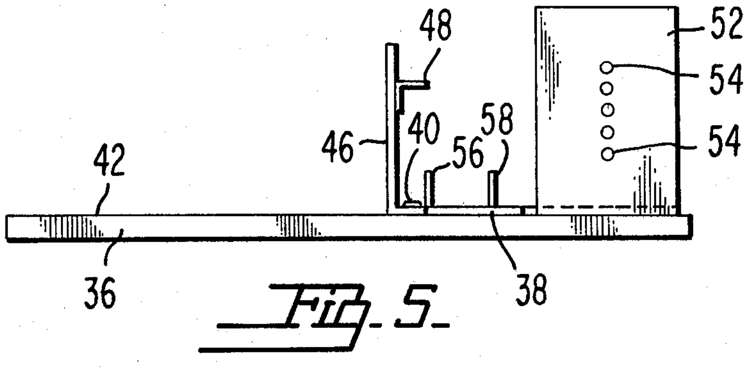
FIG. 5 is a front elevation view of the circuit board of FIG. 4.
Figure 6:
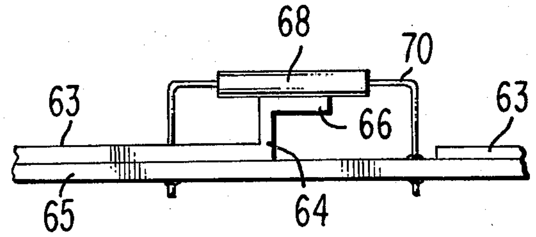
FIG. 6 is a fragmentary elevation view of part of a composite circuit board with an alternative arrangement for mounting a circuit component.

Another embodiment of a composite circuit board in accordance with the invention, is illustrated in FIGS. 4 and 5. This embodiment comprises an insulating board 36 which may be similar in composition to that of the first embodiment although it may have different dimensions. Laminated to the insulating board 36 is a metal board 38. The boards 36 and 38 are laminated together with rivets 40.

The insulating board 36 has a top surface 42, more than half of which is exposed since the metal board 38 extends over less than half of this surface. However, depending upon the particular apparatus being built and its circuit requirements, the metal board 38 may cover more or less of the surface 42 than the proportion illustrated.

The insulating board 36 also has a number of small openings 44 extending therethrough to accommodate leads of circuit components (not shown). As in the first embodiment, the underside of the board has a network of printed conductors (not shown) connected to the openings 44. The insulating board may also be provided with one or more groups of slot openings 45 for mounting components such as electrolytic condensers in cans.

This embodiment includes two shield means for isolating a part of the metal board 38 from the rest of the circuit. One shield means 46 is a vertically bent portion of the metal board 38 extending along one entire edge of the metal board. As in the previous embodiment, this shield means 46 serves as an electrical field shield. Also, the shield means 46 serves as a means to mount components and dissipate heat. In this case a pair of brackets 48 and 50 are attached to the shield 46. These brackets may support a circuit fuse (not shown), for example, or other circuit components may be mounted on the shield 46 in other ways.

Another shield means 52, comprising a vertically bent portion of the metal board 38, is disposed along part of the front edge of the board 38. This shield means 52 has openings 54 which may be used for mounting a power transistor (not shown) or other circuit component.

The metal board 38 also has two parallel vertically bent up portions 56 and 58 intended to serve as supports for resistors which emit a relatively large amount of heat. The insulated exterior shell of the resistor rests on the tops of the metal portions but the leads do not contact the metal. Beneath the opening in the metal board caused by bending up the portions 56 and 58, a portion of the insulating board 36 is removed to provide an opening 60. Resistors which are mounted across the opening 60 are cooled mainly by air circulating through the opening 60. At the same time, since the mounts 56 and 58 provide a very small area of contact for the resistors, little heat is conducted into the circuit board. It is sometimes desirable to provide this type of cooling so that the circuit board does not receive more heat than it can safely and efficiently handle. The portions 56 and 58 do not need to be bent up vertically. They may be bent at an angle to the plane of the top surface of the metal board 38.

As in the previous embodiment, the metal board 38 is also provided with a number of openings 62 surrounding and larger than the openings 44.

Either embodiment which has been illustrated may be provided with various alternative arrangements for mounting circuit components such that they may be partially cooled by air circulating around them while, at the same time, not conducting excessive heat into the insulating board. One such mounting arrangement shows part of a metal board 63 having a complex bent portion which comprises a vertically bent leg 64 and a horizontally bent leg 66. The horizontal leg 66 may support a component 68, such as a resistor which has leads 70 extending down through the circuit boards. The metal board 63 is laminated to an insulating board 65.

I claim:

1. A printed circuit composite board for use in an electronic apparatus chassis, comprising:

an insulating board having top and bottom surfaces and a sheet metal board, said boards being laminated together with said metal board resting on said top surface of said insulating board, said metal board having an area which is less than that of said insulating board, whereby said insulating board has part of its top surface exposed, a network of electrical conductors adhered to surfaces of said insulating board, means on said insulating board for mounting circuit components thereon, means on said metal board for mounting circuit components thereon, means for electrically shielding one part of an electronic circuit from another, which comprise at least one bent-up portion of said metal, and means attached to said shield means for mounting circuit components thereon.

2. A circuit board according to claim 1 wherein two portions of said metal board are vent vertically to said insulating board and parallel to each other, defining an area on said metal board and said insulating board between said vertical metal portions, an opening through said metal board and through said insulating board between said vertically bent portions permitting circulation of air between said vertical metal portions.

3. A circuit board according to claim 1 wherein said metal board includes a frame portion extending entirely around the periphery of said insulating board.

4. A circuit board according to claim 3 wherein said frame portion includes means attached thereto for mounting circuit components thereon.

5. A circuit board according to claim 1 wherein low-power circuit components are mounted on the exposed face of said insulating board, and high-power circuit elements are mounted on said metal board.

6. A printed circuit composite board for use in an electronic apparatus chassis, comprising:

an insulating board having top and bottom surfaces and a sheet metal board, said boards being laminated together, and said metal board having an area which is less than that of said insulating board, whereby said insulating board has part of its top surface exposed, a network of electrical conductors adhered to surfaces of said insulating board, means on said insulating board for mounting circuit components thereon, means on said metal board for mounting circuit components thereon, said metal board including at least one bent-up portion and a frame portion which has means for mounting circuit components thereon, said frame portion extending entirely around the periphery of said insulating board, and said frame portion having a shield means comprising a bent-up metal portion.

* * * * *